US012763787B2

(12) United States Patent
Saloio, Jr. et al.

(10) Patent No.: US 12,763,787 B2
(45) Date of Patent: Oct. 13, 2026

(54) SPEED SIGNAL CONVERTER WITH REVERSE POLARITY DETECTION AND CORRECTION

(71) Applicant: Hamilton Sundstrand Corporation, Charlotte, NC (US)

(72) Inventors: James Saloio, Jr., Ludlow, MA (US); Gary L. Hess, Somers, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 196 days.

(21) Appl. No.: 18/608,210

(22) Filed: Mar. 18, 2024

(65) Prior Publication Data

US 2025/0293702 A1 Sep. 18, 2025

(51) Int. Cl.
*H03M 1/12* (2006.01)
*G01P 3/481* (2006.01)
*G01P 21/02* (2006.01)

(52) U.S. Cl.
CPC ............... *H03M 1/12* (2013.01); *G01P 3/481* (2013.01); *G01P 21/02* (2013.01)

(58) Field of Classification Search
CPC ............ H03M 1/12; G01P 3/481; G01P 21/02
See application file for complete search history.

(56) References Cited

U.S. PATENT DOCUMENTS 4,165,481 A 8/1979 Wells et al.
4,894,613 A 1/1990 Tsugawa
5,796,232 A 8/1998 Alberter et al.
6,727,686 B2 4/2004 Beckmann et al.
7,049,859 B2 5/2006 Boyer et al.
7,145,324 B2 12/2006 Masters et al.
8,279,648 B2 10/2012 Dooley
8,362,934 B2 1/2013 Matsuzawa et al.
8,925,383 B2 1/2015 Murakami et al.
9,465,088 B2 10/2016 Putinier
11,814,964 B2 11/2023 Lopez et al.
2011/0215959 A1* 9/2011 Matsuzawa .......... H03K 5/2481 327/64
2021/0376746 A1* 12/2021 Cao ......................... H02M 1/08
2023/0160600 A1* 5/2023 Sun ......................... H04L 12/10 700/276
2024/0015053 A1* 1/2024 Jin .................... H04L 25/03885

* cited by examiner

*Primary Examiner* — Lee E Rodak
*Assistant Examiner* — Zannatul Ferdous
(74) *Attorney, Agent, or Firm* — CANTOR COLBURN LLP

(57) ABSTRACT

A speed signal converter circuit including an analog signal conditioning stage and a digital signal processing stage. The analog signal conditioning stage determines a voltage of an input speed signal, combines the voltage with an alternating current (AC) injection voltage signal having a set frequency to generate a combined voltage signal, and outputs a pulsed zero-crossing signal including a rising edge and a falling edge indicating a zero-crossing of the input speed signal based on the combined voltage signal. The digital signal processing stage determines a rising edge slope of the input speed signal and a falling edge slope of the input signal based on a rising edge and a falling edge of the pulsed zero-crossing signal, and determines an optimal edge among one of the rising edges or the falling edges based on a comparison between the rising edge slope and the falling edge slope.

18 Claims, 12 Drawing Sheets

SPEED SIGNAL CONVERTER WITH REVERSE POLARITY DETECTION AND CORRECTION

TECHNICAL FIELD

The devices and methods described herein relate to aircraft speed and timing sensing systems, and more particularly, to speed signal converter circuits.

BACKGROUND

Speed and timing sensors are used throughout the industry for turbine and jet engine controls, automotive control, and industrial controls, as well as many other systems. Speed and timing signal sensors can be implemented in a variety of ways such as, for example, as magnetic speed pickups, torque sensors, and eddy current sensors. These implementations typically produce a sinusoid-like voltage output signal where one of its zero-crossing edges (i.e., the rising edge or the falling edge) is the reference edge that aligns with the passing of a rotating gear tooth, blade, or other passing reference shape. One edge is, therefore, designed to be the most accurate edge and has a higher zero-crossing slope.

SUMMARY

According to a non-limiting embodiment, a speed signal converter circuit including an analog signal conditioning stage and a digital signal processing stage. The analog signal conditioning stage determines a voltage of an input speed signal, combines the voltage with an alternating current (AC) injection voltage signal having a set frequency to generate a combined voltage signal, and outputs a pulsed zero-crossing signal including a rising edge and a falling edge indicating a zero-crossing of the input speed signal based on the combined voltage signal. The digital signal processing stage determines a rising edge slope of the input speed signal and a falling edge slope of the input signal based on a rising edge and a falling edge of the pulsed zero-crossing signal, and determines an optimal edge among one of the rising edges or the falling edges based on a comparison between the rising edge slope and the falling edge slope.

According to one or more additional features, or in the alternative, the digital signal processing stage determines which of the rising edge slope or the falling edge slope has a larger slope, and selects the rising edge or the falling edge associated with the larger slope as the optimal edge.

According to one or more additional features, or in the alternative, the digital signal processing stage compares the optimal edge to an expected edge and detects a reverse wiring fault when the optimal edge does not match the expected edge.

According to one or more additional features, or in the alternative, the expected edge is a predetermined falling edge.

According to one or more additional features, or in the alternative, the digital signal processing stage outputs an edge selection signal commanding a controller to process the rising edge when the optimal edge does not match the expected edge.

According to one or more additional features, or in the alternative, the digital signal processing stage determines an optimal slope and a frequency of the input speed signal based on at least in part on the optimal edge.

According to one or more additional features, or in the alternative, the digital signal processing compares the optimal slope to an expected slope range having a minimum slope value and a maximum slope value, and determines one or both of a sensor fault and a wiring fault when the optimal slope does not fall within the expected slope range.

According to one or more additional features, or in the alternative, the digital signal processing stage determines an amplitude of the input speed signal based at least in part on the optimal slope.

According to one or more additional features, or in the alternative, the digital signal processing stage compares the amplitude to an expected amplitude range having a minimum amplitude value and a maximum amplitude value, and determines one or both of a sensor fault and a wiring fault when the amplitude does not fall within the expected amplitude range.

According to another non-limiting embodiment, a method of processing an input speed signal comprises determining a voltage of an input speed signal, combining the voltage with an alternating current (AC) injection voltage signal having a set frequency to generate a combined voltage signal, and generating a pulsed zero-crossing signal including a rising edge and a falling edge that indicates a zero-crossing of the input speed signal based on the combined voltage signal. The method further comprises determining a rising edge slope of the input speed signal and a falling edge slope of the input signal based on a rising edge and a falling edge of the pulsed zero-crossing signal, and determining an optimal edge among one of the rising edges or the falling edges based on a comparison between the rising edge slope and the falling edge slope.

BRIEF DESCRIPTION OF THE DRAWINGS

FIG. 7 depicts signal waveforms output from the simulation of the single-path speed signal converter circuit, including: an input speed signal (SpeedSig); an AC signal ($V_{inj}$) summed with the output differential signal (Vsig); output of the zero-crossing comparator showing rising and falling transitions; an output from a rejection pulse counter; an output signal of the rejection pulse counter depicting "rejected falling edge" counts; and an output signal that is used for the frequency to digital conversion performed by a frequency-to-digital converter;

FIG. 8 is a graph illustrating actual signal slope versus calculated results produced by the simulation of the single-path speed signal converter circuit using an asymmetrical slope sensor input signal;

FIG. 9 is a graph illustrating an actual asymmetric slope versus calculated results including measurement limitations produced by the simulation of the single-path speed signal converter circuit using an asymmetrical slope sensor input signal;

FIG. 10 is a graph illustrating actual signal amplitude versus calculated amplitude results produced by the simulation of the single-path speed signal converter circuit using an asymmetrical slope sensor input signal; and FIG. 11 is a graph illustrating single wire open fault indicated by values falling out of expected range ("X" values) produced by the simulation of the single-path speed signal converter circuit.

DETAILED DESCRIPTION

For complex control systems, it is very common for the individual components of the system to be assembled for the first time in the final application. For example, the electronic engine controller (EEC), wire harness, and sensors are first assembled prior to the production engine performance acceptance test. In some cases, certain individual components such as the wire harness or sensor could be wired or connected backwards, which effectively causes the system to act and convert on the wrong signal edge. Wiring errors include cases where the speed and timing sensor is reverse wired during sensor manufacturing or reverse wired when installed into the final application where a sensor harness connects the sensor to the speed signal converter electronics. In these cases, the system effect of the reverse wiring might not be detected during production testing but could result in inaccurate or noisy speed/timing conversion.

Figure 1A:
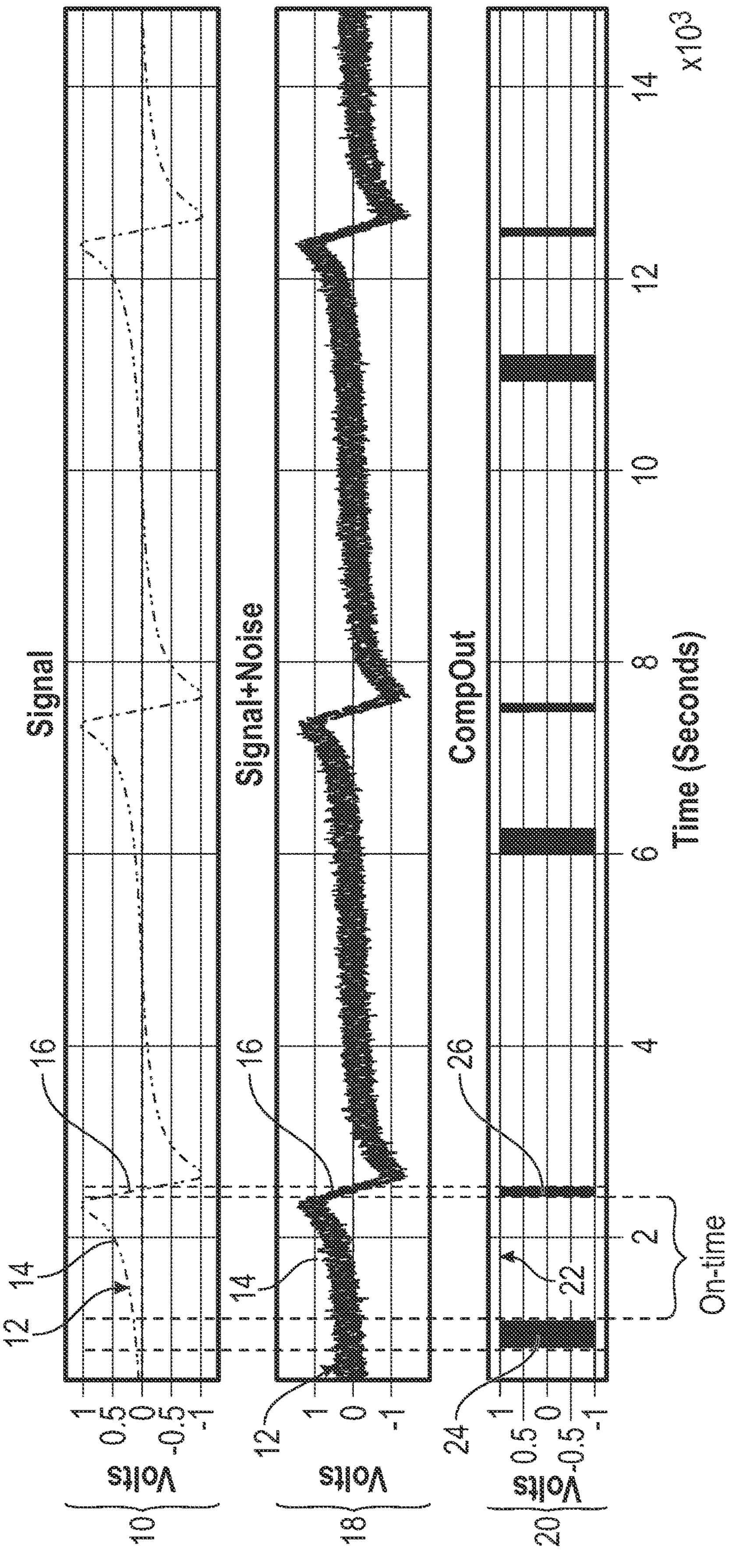
FIG. 1A illustrates signal diagrams output from a speed output sensor operating in a non-reversed (expected) connection.

FIG. 1A, for example, illustrates an example of signal waveforms generated by a conventional speed/timing signal conditioner circuit. The top pane 10 in the waveform shows a typical magnetic pickup speed signal 12 which is designed to detect the center of a passing gear tooth coincident with the falling edge of the signal 12. The sinusoid-like signal waveform shape 12 is a function of the gear tooth dimensions and dynamic spacing between the gear and magnetic pickup as well as the magnetics design of the sensor. As can be seen, the falling edge 16 of the signal 12 has a steeper slope than the rising edge 14 making it important that the correct edge be acted upon by the logic to accurately convert the signal 12 to frequency and/or timing.

The second waveform pane 18 in FIG. 1A shows the same signal 14 with the addition of system noise. The speed waveform plus noise 14 is converted into a logic signal 22 (CompOut) shown in the third waveform pain 20. Because of the noise, the logic signal 22 will be expected to have a timing variation on the rising edge 24 and the falling edge 26. When processing the logic signal 22, there is less of a timing uncertainty on the falling edge 26 than on the rising edge 24 due to the falling edge 26 having a larger slope than the rising edge 24.

The typical frequency to digital conversion logic uses a reference clock to measure the time between a reference edge (falling or rising). The frequency can be computed based on one or more CompOut periods (teeth) such that:

$$\text{Frequency}, F=(TE\_cnt/TI\_cnt)*\text{Rclk, where:}$$

TE_cnt=number of teeth used for measurement

TI_cnt=number of reference clock (Rclk) cycles measured for TE_cnt

Rclk=reference clock in Hz

The aforementioned timing error due to noise can be expressed mathematically as:

$$T_{ERROR}(\text{seconds})=[\text{Noise in volts}]/[\text{Slope in volts/sec}],\text{rising or falling edge, where:}$$

$T_{ERROR}$=the measured/detected timing error from ideal in seconds

Noise=the noise error in volts at the zero-cross detection point

Slope=the ideal signal slope in volts/sec for the rising or falling edge

Figure 1B:
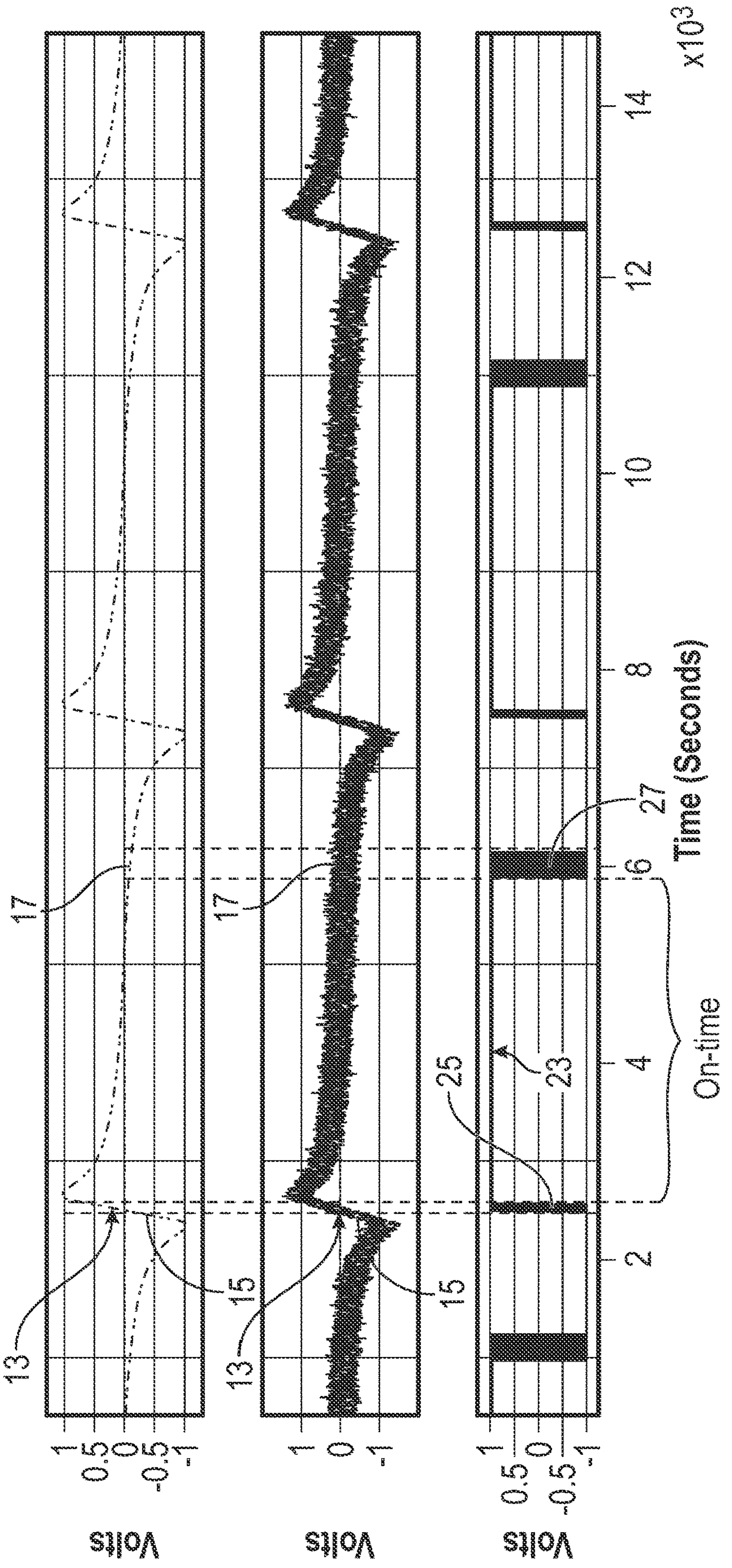
FIG. 1B illustrates signal diagrams output from a speed output sensor operating in a reversed (erroneous) connection.

When the conventional speed signal converter circuit is used with a sensor and/or wire harness that is reverse connected or reversed wired (e.g., the positive terminals or wires are connected to the negative voltage source or ground, and the negative terminals or wires are connected to the positive voltage source), the signals generated by the speed signal converter circuit is inverted as shown in FIG. 1B. As a result, the digital logic (e.g., EEC) will process the falling edge 27 of the inverted logic signal 23 which corresponds to falling edge 17 of the inverted sensor signal. Due to the wiring error and signal inversion, the falling edge 17 has a smaller slope than the rising edge 13 of inverted sensor signal 15 resulting in more falling edge timing uncertainty. The consequence is that the frequency or timing resultant will be altered and may be less accurate due to noise and the reduced signal slope. For example, the on-time of the inverted logic signal 23 is longer compared to the logic signal 22 generated by a normal connected circuit, thereby causing an inaccurate determination of the reference edge.

Various non-limiting embodiments of the present disclosure provide a speed signal converter circuit which is capable of detecting and correcting a reverse wiring fault condition. In one or more non-limiting embodiments, the speed signal converter circuit is able to compute the rising and falling edge signal slope by computing frequency/timing based on the optimal signal edge, and after the frequency is computed, the optimal signal slope can be verified. The speed signal amplitude can be computed based on sensor slope versus amplitude characteristics, or else estimated by using a sinewave approximation. The amplitude calculation can be used to detect and declare sensor and cable faults. For example, due to cable parasitics, a single open wire cable fault will reduce the signal amplitude (rather than go to zero volts) and this reduced signal amplitude can be detected by the measured signal amplitude calculation. The amplitude calculation can also be used to detect low or high signal amplitude levels due to incorrect sensor installation which, for example, can be caused by improper sensor-to-gear spacing (Gap).

The speed signal converter circuit according to a non-limiting embodiment is also capable of performing comparator hysteresis verification by setting the injection signal amplitude to be slightly greater than the comparator's trip points. In addition, detailed verification of the trip points can be accomplished by making the injection signal amplitude programmable. The injection signal is then increased/decreased in order to measure and verify the precise comparator trip amplitude.

According to a non-limiting embodiment, the speed signal converter circuit 100 can implement a signal conditioner which utilizes a digital pulsewidth rejection filter (i.e. lightning filter) to filter the speed signal. The speed signal converter circuit is capable of verifying the correct operation of the digital pulsewidth rejection filter by either reducing or turning the pulsewidth filter off during when the AC signal is injected OR by reducing the AC signal frequency so that it passes through the pulsewidth filter.

Figure 2:
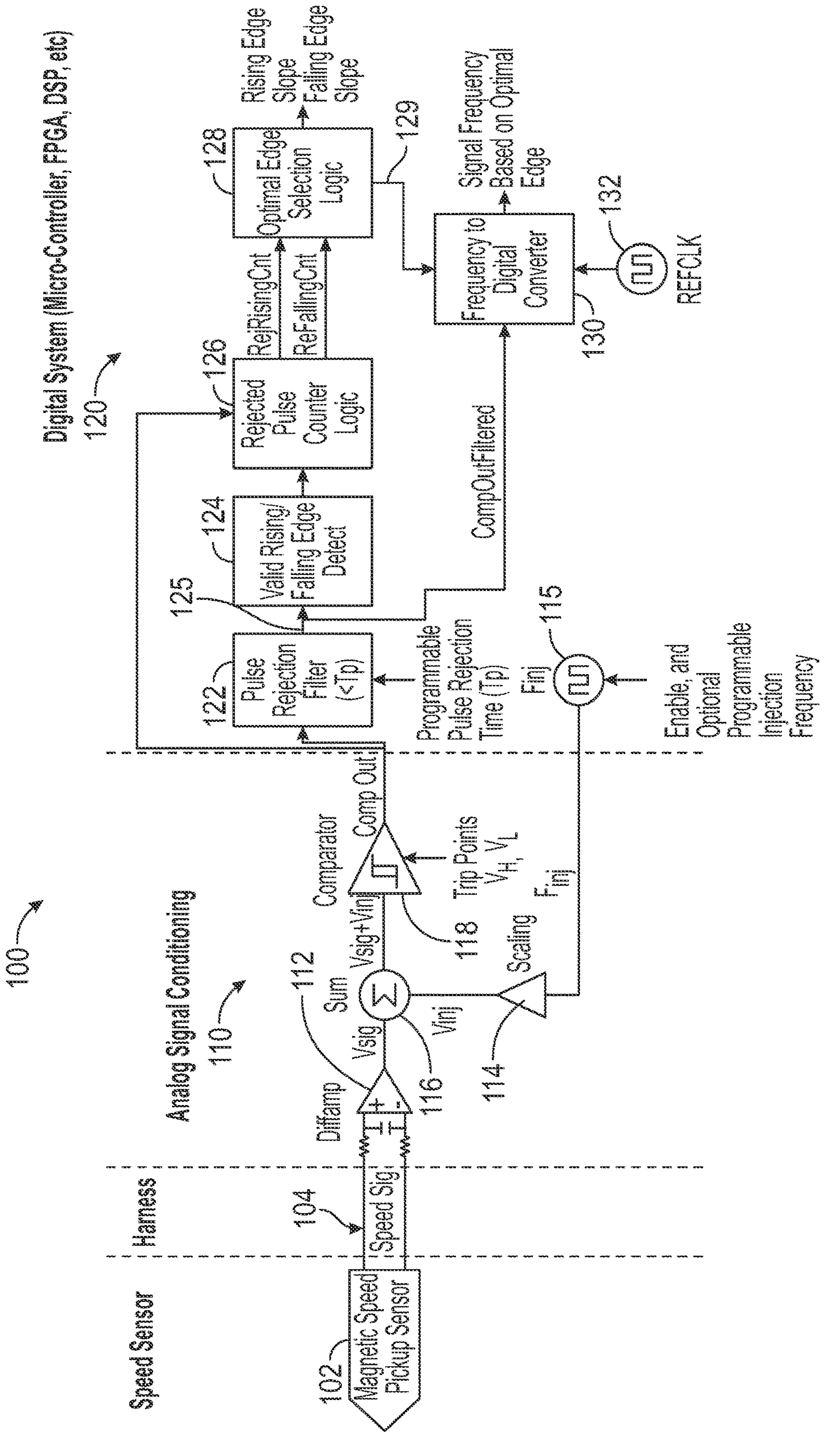
FIG. 2 is a diagram depicting a single-path speed signal converter circuit according to a non-limiting embodiment.

With reference now to FIG. 2, a speed signal converter circuit 100 is illustrated according to a non-limiting embodiment. The speed signal converter circuit 100 includes an analog signal conditioning stage 110 and a digital signal processing stage 120. The analog signal conditioning stage 110 is in signal communication with a speed sensor 102 via an input signal path 104. According to a non-limiting embodiment, the speed sensor 102 is implemented as a magnetic speed pickup sensor, and the input signal path 104 is implemented as a wire harness or electrical cable. The speed sensor 102 (e.g., magnetic speed pickup sensor) generates a voltage speed signal in response to the disturbance of its magnetic field by a ferromagnetic material, such as a gear tooth, allowing for the calculation of speed based on the frequency of these signals. According to a non-limiting embodiment, the speed sensor 102 generates a differential output including two inversely proportional signals, which aims to reduce noise and interference in the input voltage speed signal (SpeedSig).

The analog signal conditioning stage 110 includes a differential amplifier 112, an amplitude scaling device 114, a summing node 116, and a comparator 118. The non-inverting input (+) of the differential amplifier 112 receives a non-inverted voltage speed signal output from the speed sensor 102, and inverting input (−) of the differential amplifier 112 receives an inverted speed voltage signal output from the speed sensor 102. Accordingly, the differential amplifier 112 amplifies the voltage difference between its two inputs and outputs differential signal (Vsig) indicating the difference between the voltage applied at the inputs (+ and −). The output differential signal (Vsig) is output to the zero-crossing comparator 112 along a single signal path to establish a single comparator-path topology (e.g., a single-path speed signal converter circuit 100).

The amplitude scaling device 114 can be implemented as an operational amplifier (op-amp) configured as a non-inverting amplifier, which receives an analog current (AC) injection voltage signal ($V_{inj}$) having a set frequency ($F_{inj}$). The injection voltage signal ($V_{inj}$) can be a square wave generated by signal wave generator 115 included in the digital signal processing stage 120, or in other embodiments can be supplied by a separate signal wave generator.

According to a non-limiting embodiment, the injection voltage signal ($V_{inj}$) can be continuously injected. In other non-limiting embodiments, the signal injection is enabled once during initial speed signal spool up, and is disabled after polarity is determined with a built-in-test (BIT) slope and amplitude calculations being completed to achieve improved speed signal accuracy. Descriptions related to the slope and amplitude calculations are described in greater detail below. In any case, the amplitude scaling device 114 scales the injection voltage signal ($V_{inj}$) before being summed (e.g., combined) with the output different signal (Vsig) at the summing node 116.

The combined voltage signal ($Vsig+V_{inj}$) is input to the comparator 118 (e.g., a zero-cross comparator). The comparator 118 is set with a low trip point voltage ($V_L$) and a high trip point voltage ($V_H$), which determines when the output signal (CompOut) of the comparator 118 changes state. According to a non-limiting embodiment, the low trip point voltage ($V_L$) ranges from, for example, from about 0.0V to about −0.5V and a high trip point voltage ($V_H$) ranges, for example, from about 0.05V to about 0.5V. The zero cross comparator 118 detects zero-crossings of the output signal (CompOut) and effectively converts the combined signal ($Vsig+V_{inj}$) into a logic signal that is processed by the digital signal processing stage 120. According to a non-limiting embodiment, hysteresis verification of the comparator 118 can be accomplished by setting the amplitude of the injection voltage signal ($V_{inj}$) to value that is slightly greater than the comparator's trip points (e.g., the low trip point voltage ($V_L$) and the high trip point voltage ($V_H$). In addition, detailed verification of the trip points can be accomplished by making the injection signal amplitude programmable. The injection signal amplitude ($V_{inj}$) can then be increased or decreased in order to measure and verify the precise comparator trip amplitude.

The digital signal processing stage 120 can be implemented as a hardware controller such as, for example, a field programmable gate array (FPGA), digital signal processor (DSP), etc, which includes various processing modules to digitally process the logic signal (CompOut) output from the comparator 118. The processing modules include a pulse rejection filter 122, an edge detection module 124, a pulse counter module 126, an optimal edge selection module 128, a frequency-to-digital converter 130, and a clock signal generator 132.

The logic signal (CompOut) output from the comparator 118 is delivered to the pulse rejection filter 122 and the pulse counter module 126. The pulse rejection filter 122 rejects (i.e., filters out) signal pulses (positive pulses and/or negative pulses) in the logic signal (CompOut) having a time period that is less than a filter time threshold ($T_P$). According to a non-limiting embodiment, the filter time threshold ($T_P$) can range, for example, from about 4 micro-seconds (μs) to about 40 μs depending on the frequency range of the sensor input and the timing of any expected transient noise events. In a non-limiting embodiment, the frequency of the injection voltage signal ($F_{inj}$) is set such that its pulse width can be processed by the pulse rejection filter as: $F_{inj}>1/(2*Tp)$. In addition, the frequency of the injection voltage signal ($F_{inj}$) can also be set to fall within the working bandwidth of the zero crossing detector comparator 118, i.e., comparator $BW>F_{inj}>1/(2*Tp)$.

The edge detection module 124 receives the filtered logic signal (CompOut_Filtered) 125 and detects the rising and falling edges of the pulses. The detected rising and falling edges are viewed as "valid" rising and falling edges since the pulse rejection filter 122 filtered out the signal pulses having a time period that is less than a filter time threshold ($T_P$). A valid high signal state occurs when the comparator filtered logic signal (CompOut_Filtered) 125 remains high longer than the valid logic high/low transition time (Tv), and a valid low signal state occurs when the filtered logic signal (CompOut_Filtered) 125 remains low longer than valid logic high/low transition time ($T_V$).

The pulse counter 126 counts rejected pulses during a falling edge transition (i.e., high to low transition) and counts rejected pulses during a rising edge transition (i.e., low to high transition). The number of counted rejected pulses during the falling edge transition is output as a falling count signal (RejFallingCnt) and the number of counted rejected pulses during the rising edge transition is output as a rising count signal (RejRisingCnt). Once in the high state, the pulse counter 126 is reset when a pulse or pulses are rejected but a state transition is not sustained for a set counter reset time period (Ts). The number of rejected rising transition pulse counts (i.e., low to high) and rejected falling transition pulse counts (i.e., high to low) is averaged over multiple rising and falling edge transitions to improve the rejected rising and falling count accuracy.

The optimal edge selection module 128 receives the rejected falling count signal (RejFallingCnt) and the rejected rising count signal (RejRisingCnt), and is programmed with an expected optimal edge (rising or falling) which should be the edge that has the higher slope. Accordingly, the optimal edge selection module 128 can compute the rising edge slope and the falling edge slope of the input voltage speed signal (SpeedSig), and determine the edge associated with the higher slope. The computed edge associated with the higher slope is compared to the expected optimal edge in order to determine a reverse wiring fault and/or output an edge selection signal 129 that commands the frequency-to-digital converter 130 to use the correct edge for processing. For example, when the larger of the computed rising edge slope or the computed falling edge slope does not match the expected optimal edge, the optimal edge selection module 128 can output a fault signal indicating a reverse wiring fault alert and/or output the edge selection signal 129 which commands the frequency-to-digital converter 13 to select, from the filtered logic signal (CompOut_Filtered) 125, the edge with the higher slope (e.g., the rising edge) as the optimal edge.

In one or more non-limiting embodiments, the optimal edge selection module 128 can also be programmed with an expected speed signal amplitude value and compute the amplitude of the input voltage speed signal (SpeedSig). The computed amplitude can then be compared to the expected speed signal amplitude value to determine a faulty sensor and/or wiring fault. When, for example, the computed amplitude is below the expected amplitude (e.g., half the expected voltage, around 0 V, etc.), the optimal edge selection module 128 can determine a fault wire, or open fault exists (e.g., in the input signal path 104) and/or the speed sensor 102 is malfunctioning (e.g., not generating the speed signal 104).

The frequency-to-digital converter 130 utilizes the edge selection signal 128 to select the optimal edge, which is now the accurate reference edge that aligns with the passing of a rotating gear tooth, blade, or other passing reference shape. Accordingly, the frequency-to-digital converter 130 executes the frequency-to-digital conversion based on the optimal edge (i.e., the edge identified by the optimal edge selection module 128 as having the higher slope). In a non-limiting embodiment, the frequency-to-digital converter 130 utilizes a reference clock signal generated by the clock signal generator 132 to measure the time between sequential reference edges (falling or rising). The frequency (F) can be computed based on one or more periods of the filtered logic signal (CompOut_Filtered) 125 (e.g., sensed teeth) such that:

F = (TE_cnt/TI_cnt)*Rclk, where:
TE_cnt = number of teeth used for measurement;
TI_cnt = number of reference clock (Rclk) cycles measured for TE_cnt;
and
Rclk = reference clock in Hz Using the computed speed signal frequency and optimal edge slope, the speed signal amplitude can be computed based on an expected sensor slope versus frequency and amplitude characteristics, or else estimated by using a sinewave approximation. According to a non-limiting embodiment, the signal amplitude is computed (e.g., by the frequency-to-digital converter 130 or another controller) after computing both the optimal edge slope 128 and the frequency based on the optimal edge 130. The amplitude calculation can then be used to detect and declare sensor and cable faults.

Figure 3:
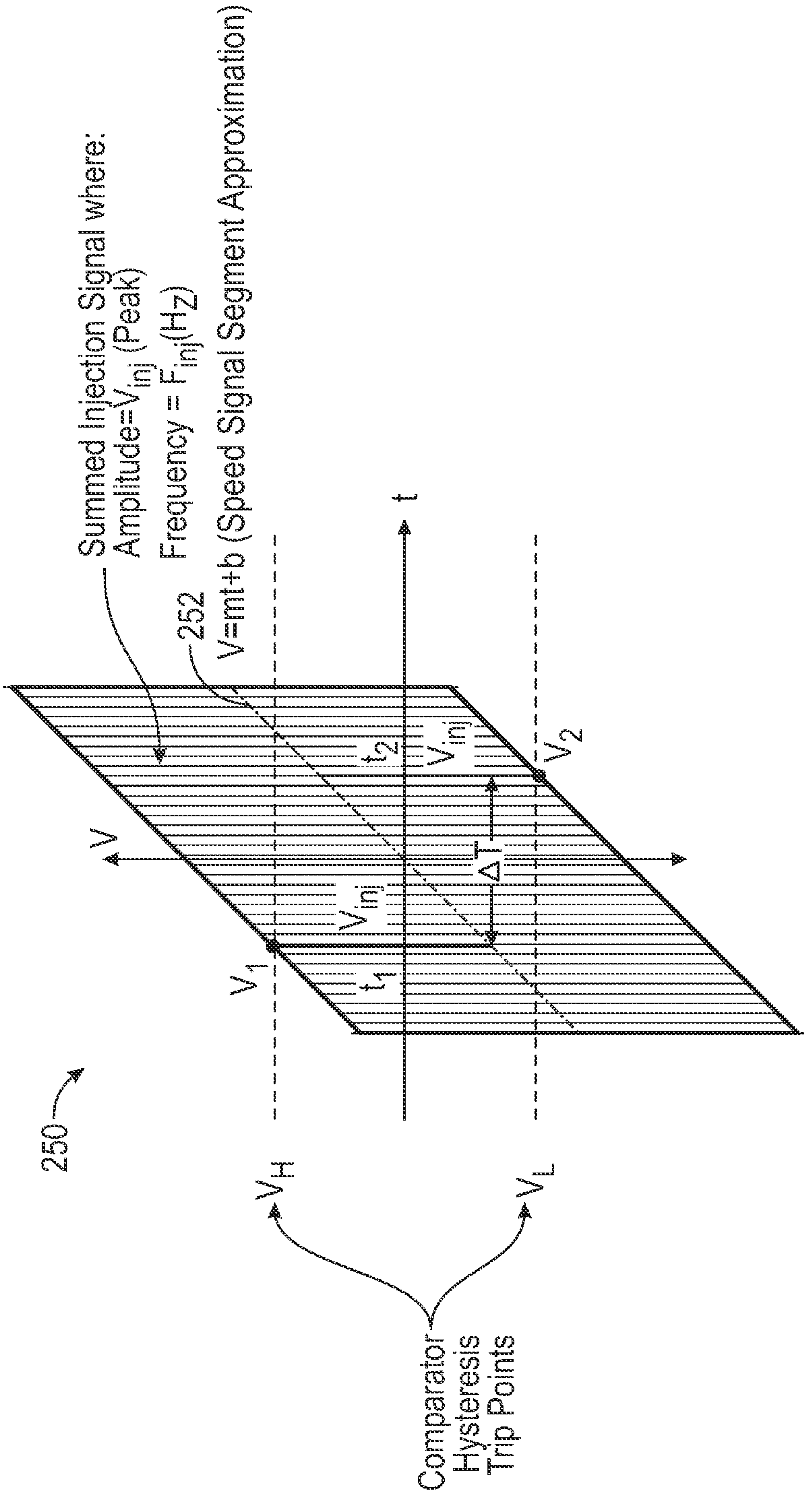
FIG. 3 is a diagram depicting signal segment used for to derive the rising edge slope (mrise) and falling edge slope (mfall) of the pulses included in the input speed signal (SpeedSig) according to a non-limiting embodiment of the present disclosure.

FIG. 3 illustrates a signal segment diagram 250 used for deriving the rising edge slope (mrise) and the falling edge slope (mfall) of the pulses included in the input speed signal (SpeedSig) according to a non-limiting embodiment of the present disclosure. The signal segment diagram 250 depicts a speed signal segment 252 crossing through the trip points (e.g., the high trip point voltage ($V_H$) and the low trip point voltage ($V_L$)) of the comparator 118.

According to a non-limiting embodiment, the speed signal segment can be approximated as: V=mt+b, where:

V=the amplitude;

m=the slope;

t=time; and b=an initial signal voltage at the start of observation or measurement.

The voltage ($V_1$) of the comparator high trip point ($V_H$) can be calculated as: $V_1=V_H=mt_1+V_{inj}$.

The voltage ($V_2$) of the comparator low trip point ($V_L$) can be calculated as: $V_2=V_L=mt_2-V_{inj}$.

The times (t1 and t2) at which VH and VL are reached, respectively, while considering the effect of the summed injection peak amplitude (Vinj) can be expressed as:

$$t_1 = \frac{V_H - V_{inj}}{m}$$

$$t_2 = \frac{V_L + V_{inj}}{m}$$

Accordingly, the time interval (Δt) between the comparator switching from its high state ($V_H$) to its low state ($V_L$) (or vice versa) can be expressed as:

$$\Delta t = t_2 - t_1 = \frac{V_L - V_H + 2V_{inj}}{m}$$

Re-arranging the terms (e.g., solving for m), the slope (m) of the comparator input signal can be calculated as:

$$m = \frac{V_L - V_H + 2V_{inj}}{\Delta t}$$

According to a non-limiting embodiment, Δt is determined based on the number of rejected rising edges (RejRiseCnt) and the frequency of the injected AC voltage signal (Finj). For the rising slope (mrise), for example, Δt can be computed as:

$$\Delta t_{mrise} = \frac{RejRiseCnt(\,)}{Finj}$$

Likewise, for the falling slope (mfall) for example, Δt can be computed as:

$$\Delta t_{mfall} = \frac{RejFallCnt(\,)}{Finj}$$

Once the slope (m) of the comparator input signal is determined, the peak amplitude (Vp) of the input signal can be calculated based on the known slope of a pure sinewave. The signal amplitude calculation is used for cases where a sinewave's zero-crossing slope characteristic approximates the optimal edge (larger slope) of the actual speed sensor input signal:

$$Vp = \frac{m}{2\pi F},$$

where:

m=the slope of the input signal at zero-crossing; and

F=F/D converted frequency of the input signal.

In some applications, the sensor signal (e.g., sinewave) is compressed relative to the F/D converted gear-to-gear frequency due to phonic wheel gear spacing and/or the gear shape. In these cases, the sinewave approximation can be "fitted" to the known signal by applying a compression factor (Cf) to the edge with the steepest slope. This sinewave approximation can be expressed as:

$$Vp = \frac{m}{2\pi F(Cf)},$$

where:

Cf=the compression factor or fitting constant applied (e.g., multiplied) to best fit the known tooth/sensor generated slope (m).

According to a non-limiting embodiment, the compression factor (Cf) is set to "1" for a pure sinewave. In some embodiments, the slope and/or amplitude computed at the input of the comparator 118 can be translated to the input signal (sensor signal) by dividing by the signal conditioning gain as a function signal frequency (F).

Figure 4:
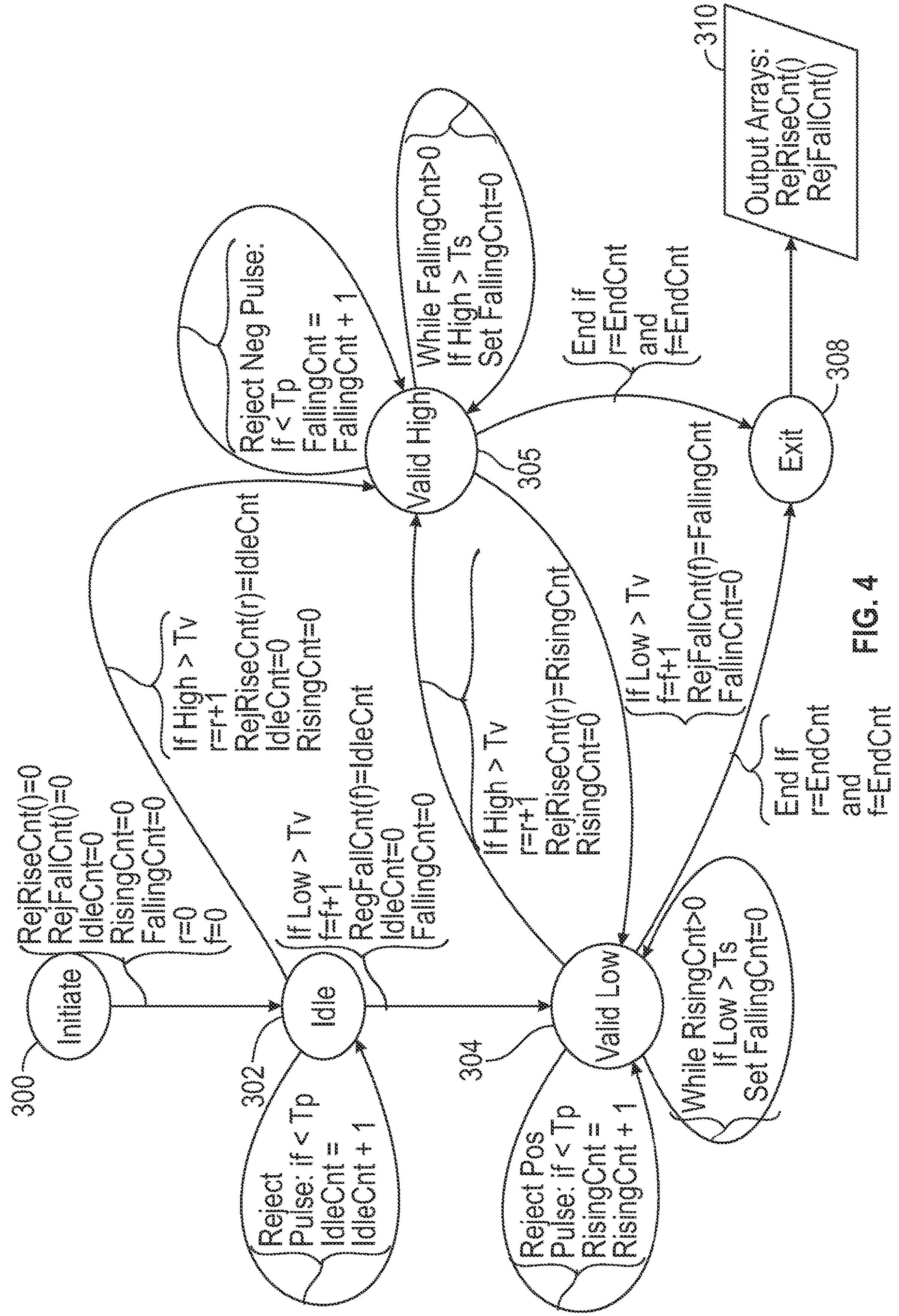
FIG. 4 is a state diagram illustrating the operating states performed by a speed signal converter circuit to generate rising edge and falling edge pulse counts according to a non-limiting embodiment of the present disclosure.

Turning now to FIG. 4, a state diagram illustrates the operating states performed by the speed signal converter circuit 100 to generate rising edge and falling edge pulse counts according to a non-limiting embodiment of the present disclosure. At initiation 300, the array size for the number of detected pulses during idle (IdleCnt) is zero ("0"), the rising edge count (r) is zero "0", the falling edge count (f) is zero "0", the array of rejected pulses for each rising edge (RejRiseCnt) is zero ("0"), the array of rejected pulses for each falling edge (RejFallCnt) is zero ("0"), RisingCnt is zero "0", and FallingCnt is zero "0". The IdleCnt refers to the count value at the starting state during which there is a need to determine whether the first valid state is high or low. The rising edge count (r) refers to the up counter, which keeps track of the number of rising edge occurrences in the RejRisCnt( ) array. The falling edge count (f) refers to the up counter, which keeps track of the number of falling edge occurrences in the RejFallCnt array. The RejRiseCnt refers to the current count of the number of rejected rising edges prior to transitioning to a valid high state. The RejFallCnt refers to the current count of the number of rejected falling edges prior to transitioning to a valid low state.

At idle 302 (e.g., starting state during which there is a need to determine whether the first valid state is high or low), the logic decides to reject signal pulses (both positive or negative pulses) in the logic signal (CompOut), transition to a valid low detection state 304, or transition to a valid high detection state 305. The decision to reject a signal pulse based on a comparison between a time period (T) of the signal pulse and a filter time threshold ($T_P$). When the time period (T) of the signal pulse is less than $T_P$ the logic increments the IdleCnt by "1" and continues deciding whether to reject pulses in the logic signal (CompOut). When the time period (T) of the signal pulse is greater than $T_P$, the logic determines whether the time period (T) of the signal pulse is lower than or greater than a time period ($T_V$) needed to transition the zero-crossing comparator 118 from a high logic state to a low logic state. When the time period (T) of signal pulse is lower than $T_V$, the logic increments the falling edge count (f) by "1", sets IdleCnt to "0", sets RejFallCnt (f) equal to the IdleCnt, sets FallingCnt to "0", and transitions to the valid low detection state 304. When, however, the time period (T) of signal pulse is greater than $T_V$, the logic increments the rising edge count (r) by "1", sets IdleCnt to "0", sets RejRiseCnt (r) equal to the IdleCnt, sets RisingCnt to "0", and transitions to the valid high detection state 305.

At the valid low detection state 304, the logic confirms a valid low signal state of the zero-crossing comparator 118, transitions to the valid high state 305, or transitions to an exit state 308. When in the "valid low state (and r<EndCnt), the next expected state is the "valid high state" 305. Accordingly, a RisingCnt counter will track the number of rejected pulses (<Tp) until the signal transitions to the high state 305 (e.g., High>$T_V$). According to a non-limiting embodiment, there is an added time filter (Ts) intended to filter out spurious pulse rejections that do not result in a transition to the next valid state. When in the valid low state, the rejected pulse counter is reset if a pulse or pulses are rejected but a state transition is not sustained for Ts seconds. Accordingly, the logic exits at state 308 and the arrays (e.g., RejRiseCnt (r) and RejFallCnt (r)) are output at state 310.

At the valid high detection state 305, the logic confirms a valid high signal state of the zero-crossing comparator 118, transitions to the valid low state 304, or transitions to the exit state 306, when in the "valid high state" (and r<EndCnt), the next expected state is the "valid low state" 304. Accordingly, the RisingCnt counter tracks the number of rejected pulses (<Tp) until the signal transitions to the low state 304 (e.g., Low>$T_V$). According to a non-limiting embodiment, there is an added time filter (Ts) intended to filter out spurious pulse rejections that do not result in a transition to the next valid state. When in the valid high state, the rejected pulse counter is reset if a pulse or pulses are rejected but a state transition is not sustained for Ts seconds. Accordingly, the logic exits at state 308 and the arrays (e.g., RejRiseCnt (r) and RejFallCnt (r)) are output at state 310.

Figure 5:
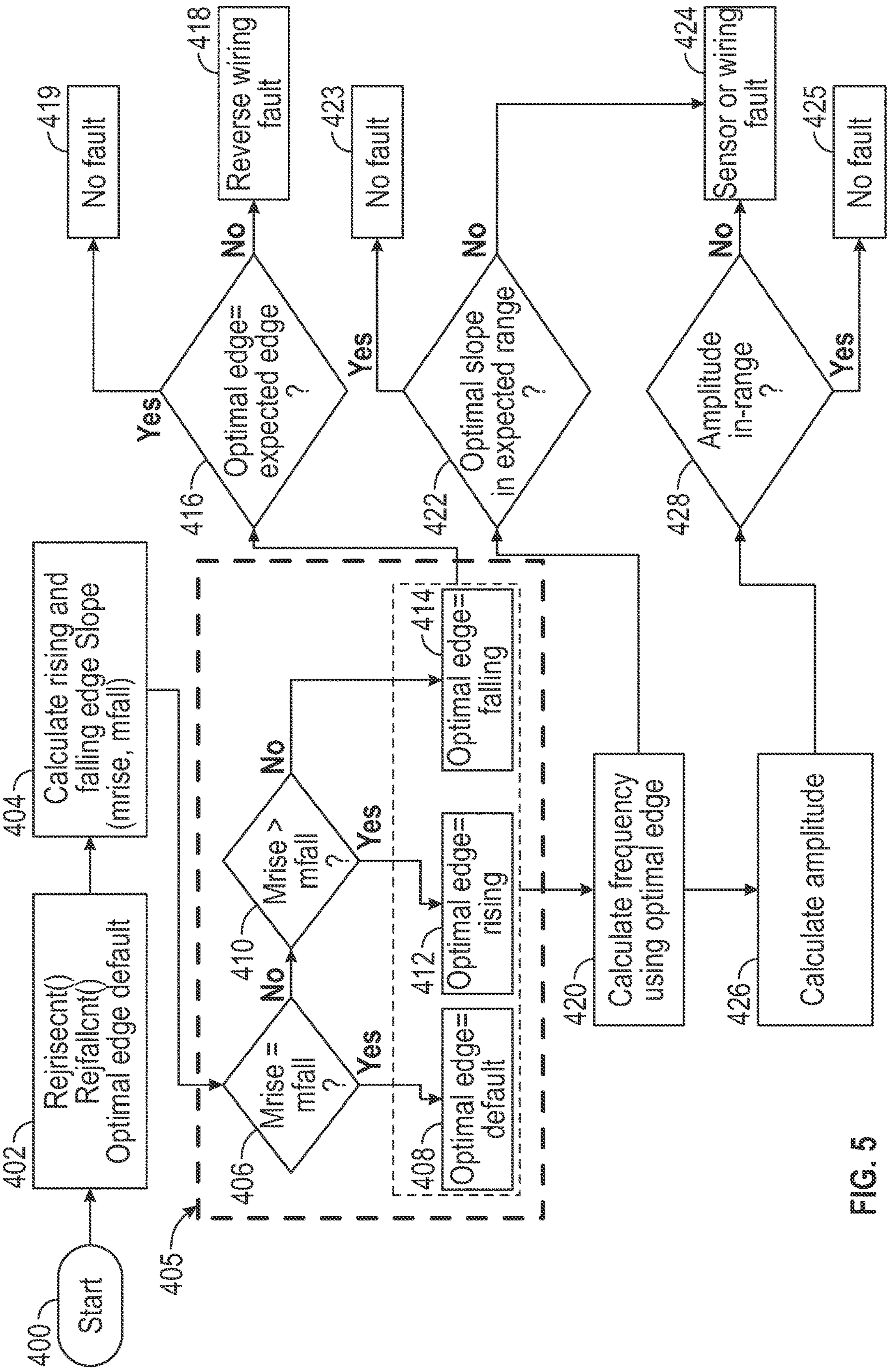
FIG. 5 is a flow diagram illustrating a method of performing optimal edge logic and fault diagnostics performed by a speed signal converter circuit according to a non-limiting embodiment of the present disclosure.

Turning now to FIG. 5, a method of performing optimal edge logic and fault diagnostics performed by a speed signal converter circuit is illustrated according to a non-limiting embodiment of the present disclosure. The method begins at operation 400, and proceeds to determine an array of rejected pulses for each rising edge (RejRiseCnt), an array of rejected pulses for each falling edge (RejFallCnt), and a default optimal edge. The default optimal edge refers to an initial determination of the reference edge. According to a non-limiting embodiment, the default optimal edge would typically be set to the expected optimal edge based on the correct wiring and sensor installation. This default optimal edge takes into account an event where the rising and falling edges are calculated to be equal. At operation 404, a rising edge slope (mrise) and falling edge slope (mfall) associated with the pulses included in the input speed signal (SpeedSig) are determined. At operation 405, a verification of the default optimal edge is performed. The verification includes determining whether the rising edge slope (mrise) equals the falling edge slope (mfall) at operation 406. When mrise equals mfall, the default optimal edge is confirmed as the optimal edge. For example, a default optimal edge initially determined as a rising edge is confirmed as the optimal edge and a default optimal edge initially determined as a falling edge is confirmed as the optimal edge.

When mrise does not equal mfall, a determination is made as to whether mrise is greater than mfall at operation 410. When, mrise is greater than mfall, the optimal edge to be used as the reference edge is determined as a rising edge at operation 412. When, however, mrise is less than mfall, the optimal edge to be used as the reference edge is determined as a falling edge at operation 414.

Following the verification of the default optimal edge at operation 405, a determination is made as to whether optimal edge is the expected edge to be used as the reference edge at operation 416. According to a non-limiting embodiment, the expected optimal edge is determined based on which edge of the signal should have a higher slope given correct wiring and sensor installation. When the optimal edge is not the expected edge, a reverse wiring fault is alerted at operation 418. Otherwise, no fault is determined at operation 419.

Following the verification of the default optimal edge at operation 405, the method also proceeds to operation 420 to determine an optimal slope and a frequency of the speed signal (SpeedSig), each of which are based on the optimal edge. At operation 422, a determination is made as to whether the optimal slope is within an expected slope range based on the calculated frequency. For example, the optimal edge selection module 128 can be programmed with an expected slope range having a minimum slope value and a maximum slope value, and can compare the optimal slope to the expected slope range. When the optimal slope is not within the expected slope range, a sensor fault alert and/or wiring fault alert is generated at operation 424. Otherwise, no fault is determined at operation 423.

Turning to operation 426, the amplitude of the speed signal (SpeedSig) is determined based on the optimal slope. At operation 428, a determination is made as to whether the speed signal amplitude is within an expected amplitude range. For example, the optimal edge selection module 128 can be programmed with an expected amplitude range having a minimum amplitude value and a maximum amplitude value, and can compare the amplitude to the expected amplitude range. When the speed signal amplitude is not within the expected amplitude range, a sensor fault alert and/or wiring fault alert is generated at operation 424. Otherwise, no fault is determined at operation 425.

Figure 6:
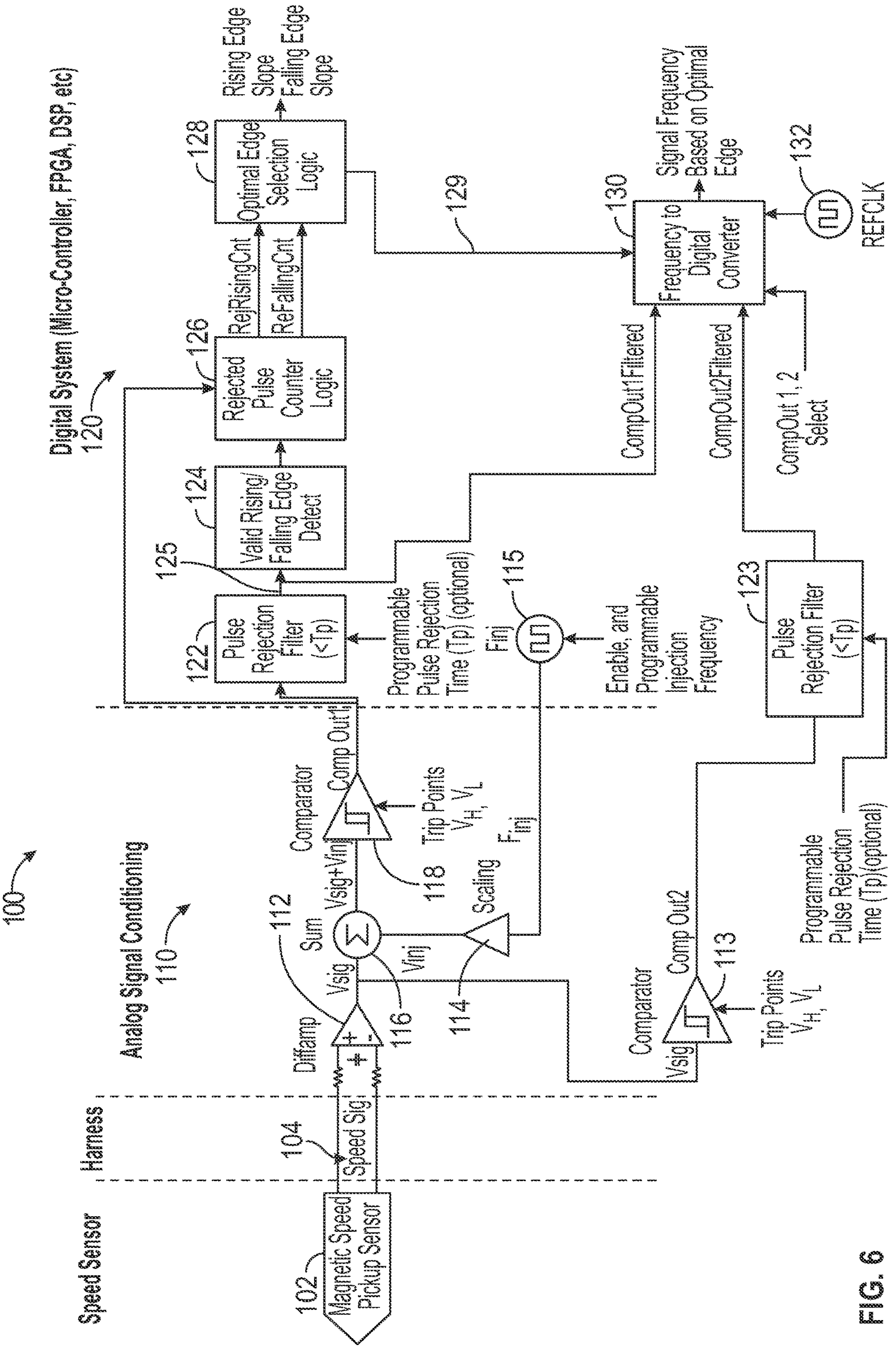
FIG. 6 is a diagram depicting a dual-path speed signal converter circuit according to a non-limiting embodiment of the present disclosure.

Turning now to FIG. 6, a speed signal converter circuit 100 is illustrated according to another non-limiting embodiment of the present disclosure. The speed signal converter circuit 100 shown in FIG. 6 has a dual comparator path topology, which includes a second zero-crossing comparator 113 and a second pulse rejection filter 123.

The differential signal (Vsig) output from the differential amplifier 112 is delivered to the first zero-crossing comparator 118 along the first signal path and to the second zero-crossing comparator along the second signal path, thereby establishing the dual comparator-path topology (e.g., a dual-path speed signal converter circuit 100). The first zero-crossing comparator 118 receives the signal combined with the injection voltage signal ($Vsig+V_{inj}$) from the first comparator signal path, and performs the optimal edge detection to generate the edge selection signal 129 as described above. The frequency-to-digital converter 130 can then set or "lock-in" the optimal edge as indicated by the edge selection signal 129 for all subsequent signal processing. The second comparator signal path 113 allows for the injection voltage signal ($V_{inj}$) to be continuously delivered to the first zero-crossing comparator 118. Accordingly, the frequency-to-digital converter 130 can continuously perform accurate speed/timing processing and measurements despite a reverse wiring connection because it has "locked in" the correct optimal edge to be used as the reference edge as indicated by the edge selection signal 129.

Figure 7:
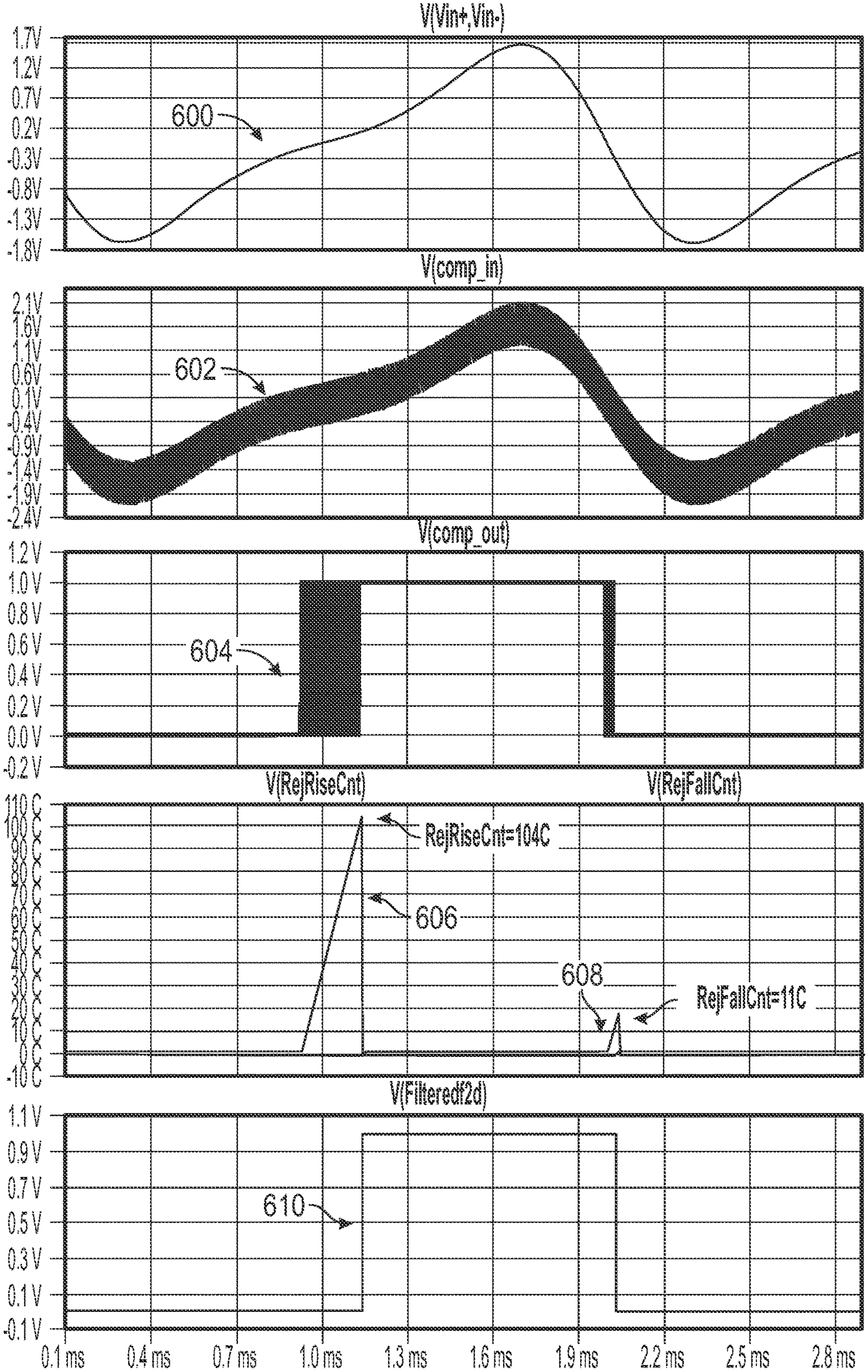
FIGS. 7 through 11 depict example results obtained from a simulation of the single-path speed signal converter circuit shown in FIG. 2, where.

FIGS. 7 through 11 depict example results obtained from a simulation of the single-path speed signal converter circuit 100 shown in FIG. 2. FIG. 7 depicts signal diagrams output from a simulation of the single-path speed signal converter circuit 100. The single-path speed signal converter circuit 100 was simulated using the following parameters:

Front-end RC filter
- R1+R2=20K ohm
- C=200 pF

Comparator Trip Points
- VH=0.30 V
- VL=−0.26 V

Signal Injection Squarewave at the Comparator Input
- $F_{inj}$=500 KHz
- Vinj=0.418 Vp With continued reference to FIG. 7, a 500 Hz input signal (SpeedSig) having an asymmetrical slope is indicated as signal 600. Signal 602 indicates a 500 Khz AC signal ($V_{inj}$) summed with the output differential signal (Vsig), which are then input to the zero-crossing comparator 118. Signal 604 indicates the output of the zero-crossing comparator 118 showing the rising and falling transitions that are detected but then rejected by the pulse rejection filter 122. The signal 606 is the output of the rejection pulse counter 126, which tracks the "rejected rising edge" transitions. Signal 608 is the output of the rejection pulse counter 126, which tracks the "rejected falling edge" counts. Signal 610 indicates the output 125 of the pulse rejection filter 122, which is the signal that is used for the frequency to digital conversion (or timing reference) performed by the frequency-to-digital converter 130.

Figure 8:
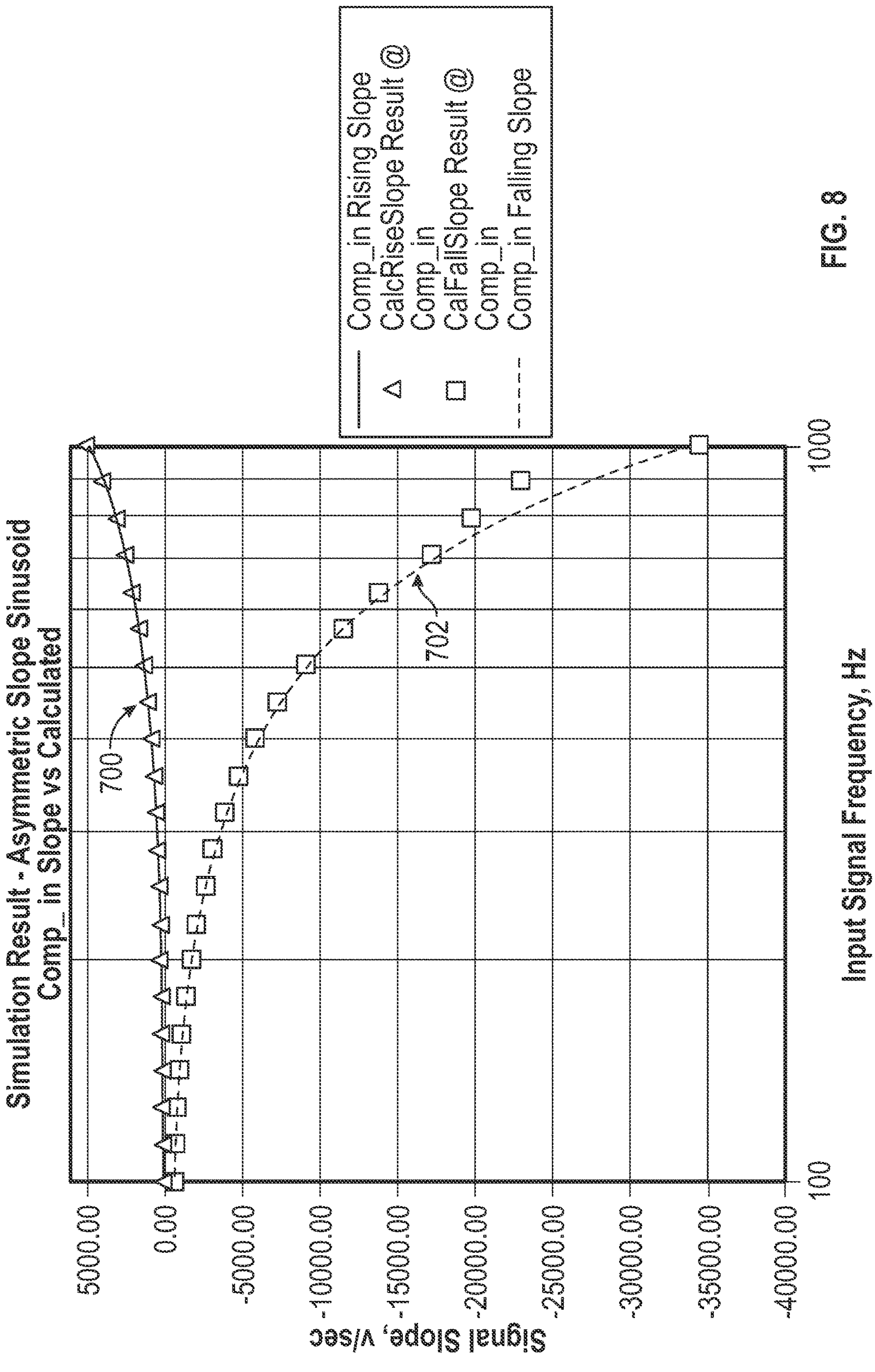

FIG. 8 is a graph illustrating an asymmetrical sloped speed sensor signal (SpeedSig) modeled with an input signal of 0.5 Vp at 100 Hz with increasing amplitude of 4 dB per octave. The simulation illustrates that the calculated rising and falling slopes match the expected slopes.

Figure 9:
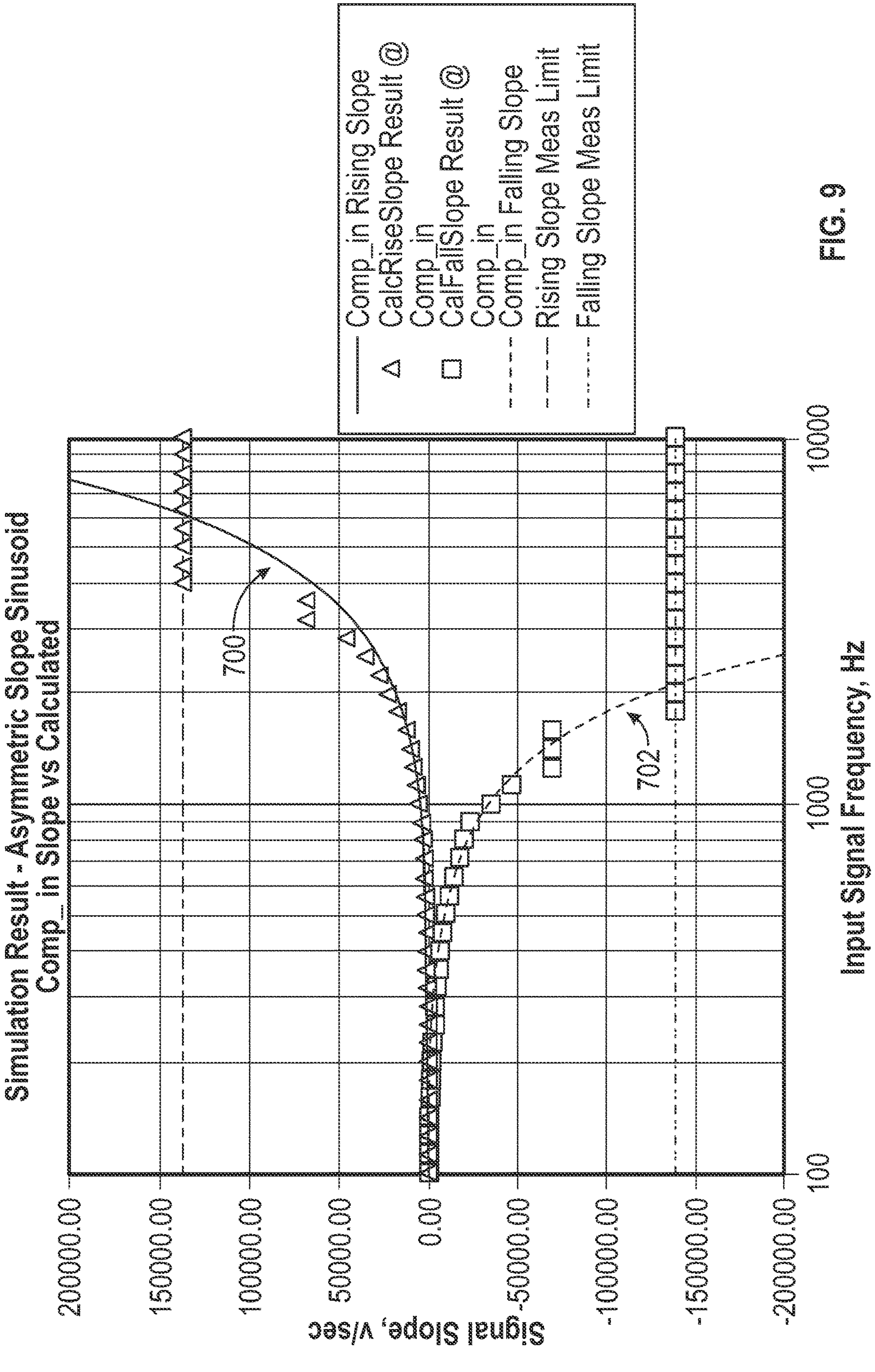

FIG. 9 is a graph illustrating an actual asymmetric slope versus calculated results. The graph includes measurement limitations produced by the simulation of the single-path speed signal converter circuit using an asymmetrical sensor input signal. In FIG. 9, the slope measurement limitations appear as the rising (mrise) or falling slope (mfall) approaches a condition where the number of Finj cycles counted during the rising slope (RejRiseCnt) or falling slope; (RejFallCnt) is set to one (i.e., Pcnt=1)

Figure 10:
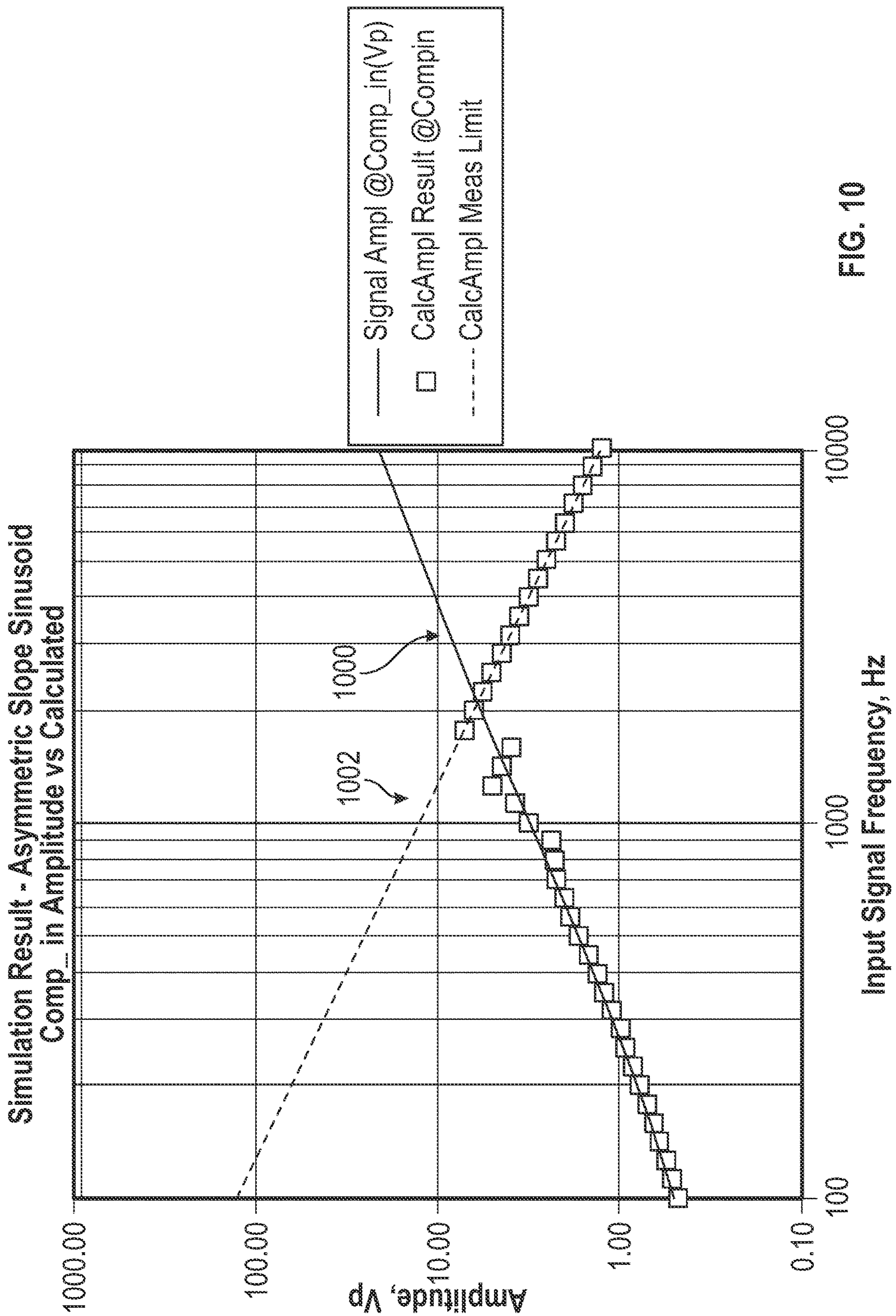

FIG. 10 is a graph illustrating actual signal amplitude versus calculated amplitude results. The results were obtained when using an asymmetrical sloped speed sensor signal (SpeedSig).

Figure 11:
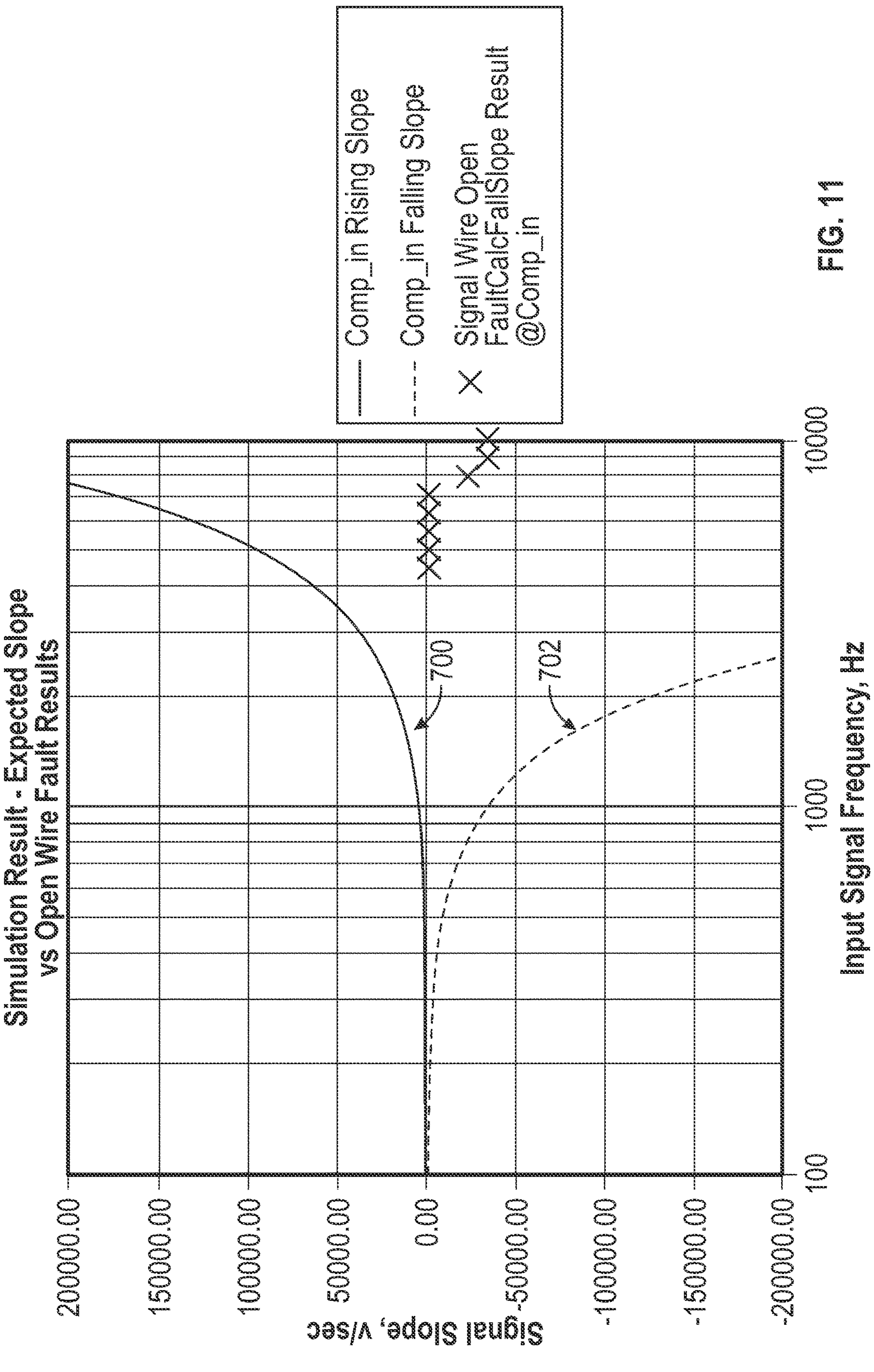

FIG. 11 is a graph illustrating single wire open fault indicated by values falling out of expected range ("X" values) produced by the simulation of the single-path speed signal converter circuit. In this example, a fault scenario is simulated where a single sensor signal wire is open in a cable harness (e.g., the input signal path 104). The simulated speed signal converter circuit 100 models typical cable capacitance which forms a reference for a partial signal to pass to the signal conditioning electronics at higher frequencies. In the example shown, frequencies above about 4 KHz are detected and converted whereas at lower frequencies, the signal is below the comparator hysteresis and a signal is not detected. For the frequencies above 4 KHz, it is evident that the signal slope is well below the expected slopes illustrated by the positive slope signal 700 and negative slope signal 702. Accordingly, the speed signal converter circuit 100 can detect an open wiring fault (e.g., using the frequency-to-digital converter 130) even at high frequencies.

In the descriptions of the flowcharts herein, the operations may be performed in a different order than the order shown, or the operations may be performed in different orders or at different times. Certain operations may also be left out of the flowcharts, one or more operations may be repeated, or other operations may be added to the flowcharts.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A speed signal converter circuit comprising:

an analog signal conditioning stage configured to determine a voltage of an input speed signal, combine the voltage with an alternating current (AC) injection voltage signal having a set frequency to generate a combined voltage signal, and output a pulsed zero-crossing signal including a rising edge and a falling edge indicating a zero-crossing of the input speed signal based on the combined voltage signal; and a digital signal processing stage in signal communication with the analog signal conditioning stage, the digital signal processing stage configured to determine a rising edge slope of the input speed signal and a falling edge slope of the input signal based on a rising edge and a falling edge of the pulsed zero-crossing signal, and to determine an optimal edge among either the rising edge or the falling edge based on a comparison between the rising edge slope and the falling edge slope, wherein the digital signal processing stage compares the optimal edge to an expected edge and detects a reverse wiring fault when the optimal edge does not match the expected edge.

2. The speed signal converter of claim 1, wherein the digital signal processing stage determines whether the rising edge slope or the falling edge slope has a larger slope, and selects the rising edge or the falling edge associated with the larger slope as the optimal edge.

3. The speed signal converter of claim 1, wherein the expected edge is a predetermined falling edge.

4. The speed signal converter of claim 3, wherein the digital signal processing stage outputs an edge selection signal commanding a controller to process the rising edge when the optimal edge does not match the expected edge.

5. The speed signal converter of claim 3, wherein the digital signal processing stage determines an optimal slope and a frequency of the input speed signal based at least in part on the optimal edge.

6. The speed signal converter of claim 5, wherein the digital signal processing stage compares the optimal slope to an expected slope range having a minimum slope value and a maximum slope value, and determines one or both of a sensor fault and a wiring fault when the optimal slope does not fall within the expected slope range.

7. The speed signal converter of claim 6, wherein the digital signal processing stage determines an amplitude of the input speed signal based at least in part on the optimal slope.

8. The speed signal converter of claim 7, wherein the digital signal processing stage compares the amplitude to an expected amplitude range having a minimum amplitude value and a maximum amplitude value, and determines one or both of a sensor fault and a wiring fault when the amplitude does not fall within the expected amplitude range.

9. The speed signal converter of claim 1, wherein the digital signal processing stage includes a pulse rejection filter configured to:

process the combined voltage signal to reject signal pluses the AC injection voltage signal corresponding to the set frequency;

count a number of first rejected pulses corresponding to the rising edge to determine a first rejected pulse count sum and a number of second rejected pulses corresponding to the falling edge to determine a second rejected pulse sum; and determine a first slope of the rising edge based on the first rejected pulse count sum and a second slope of the falling edge based on the second rejected pulse sum.

10. A method of processing an input speed signal, the method comprising:

determining a voltage of an input speed signal;

combining the voltage with an alternating current (AC) injection voltage signal having a set frequency to generate a combined voltage signal;

generating a pulsed zero-crossing signal including a rising edge and a falling edge that indicates a zero-crossing of the input speed signal based on the combined voltage signal;

determining a rising edge slope of the input speed signal and a falling edge slope of the input signal based on a rising edge and a falling edge of the pulsed zero-crossing signal; and determining an optimal edge among either the rising edge or the falling edge based on a comparison between the rising edge slope and the falling edge slope;

comparing the optimal edge to an expected edge; and detecting a reverse wiring fault when the optimal edge does not match the expected edge.

11. The method of claim 10, further comprising:

determining whether the rising edge slope or the falling edge slope has a larger slope; and selecting the rising edge or the falling edge associated with the larger slope as the optimal edge.

12. The method of claim 10, wherein the expected edge is a predetermined falling edge.

13. The method of claim 12, further comprising commanding a controller to process the rising edge when the optimal edge does not match the expected edge.

14. The method of claim 12, further comprising determining an optimal slope and a frequency of the input speed signal based on at least in part on the optimal edge.

15. The method of claim 14, further comprising:

comparing the optimal slope to an expected slope range having a minimum slope value and a maximum slope value; and determining one or both of a sensor fault and a wiring fault when the optimal slope does not fall within the expected slope range.

16. The method of claim 15, further comprising determining an amplitude of the input speed signal based at least in part on the optimal slope.

17. The method of claim 16, further comprising:

comparing the amplitude to an expected amplitude range having a minimum amplitude value and a maximum amplitude value; and determining one or both of a sensor fault and a wiring fault when the amplitude does not fall within the expected amplitude range.

18. The method of claim 10, wherein determining the rising edge slope and the falling edge slope comprises:

The speed signal converter of claim 1, wherein the digital signal processing stage comprises:

processing the combined voltage signal to reject signal pluses the AC injection voltage signal corresponding to the set frequency;

counting a number of first rejected pulses corresponding to the rising edge to determine a first rejected pulse count sum and a number of second rejected pulses corresponding to the falling edge to determine a second rejected pulse sum; and determining a first slope of the rising edge based on the first rejected pulse count sum and a second slope of the falling edge based on the second rejected pulse sum.

* * * * *